(12) United States Patent
Jeong

(10) Patent No.: US 7,303,958 B2
(45) Date of Patent: Dec. 4, 2007

(54) SEMICONDUCTOR DEVICE AND METHOD OF MANUFACTURING THE SAME

(75) Inventor: Cheol Mo Jeong, Kyungki-Do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 11/728,504

(22) Filed: Mar. 26, 2007

(65) Prior Publication Data

US 2007/0176296 A1    Aug. 2, 2007

Related U.S. Application Data

(62) Division of application No. 11/027,153, filed on Dec. 30, 2004.

(30) Foreign Application Priority Data

Oct. 20, 2004    (KR) ............................ 2004-0084179

(51) Int. Cl.
    *H01L 21/336* (2006.01)
(52) U.S. Cl. ...................... 438/257; 438/259; 438/266; 257/E21.68; 257/314; 257/315

(58) Field of Classification Search ................ 438/257, 438/259, 266; 257/E21.68, E21.683, 314–316
See application file for complete search history.

(56) References Cited

U.S. PATENT DOCUMENTS 6,893,918 B1 * 5/2005 Wang et al. ................ 438/257
6,984,559 B2 * 1/2006 Wang et al. ................ 438/257

FOREIGN PATENT DOCUMENTS

JP          2003-273209          9/2003

* cited by examiner

*Primary Examiner*—Hsien-Ming Lee
(74) *Attorney, Agent, or Firm*—Marshall, Gerstein & Borun LLP

(57) ABSTRACT

Disclosed herein is a semiconductor device and method of manufacturing the same. A step between a memory cell formed in a cell region and a transistor formed in a peripheral circuit region is minimized, and the height of a gate in the memory cell is minimized. Accordingly, subsequent processes are facilitated and the electrical property of the device is thus improved.

25 Claims, 9 Drawing Sheets

CELL REGION(A-A')     PERIPHERAL CIRCUIT REGION

CELL REGION(B-B')

CELL REGION(A-A')     PERIPHERAL CIRCUIT REGION

SEMICONDUCTOR DEVICE AND METHOD OF MANUFACTURING THE SAME

CROSS REFERENCE TO RELATED APPLICATIONS

This is a divisional of U.S. application Ser. No. 11/027,153 (the disclosure of which is incorporated herein by reference in its entirety), filed Dec. 30, 2004, which claims foreign priority from Korean Application No. KR 2004-0084179, filed Oct. 20, 2004.

BACKGROUND

1. Technical Field

A semiconductor device and method of manufacturing the same are disclosed in which the size of steps between memory cells and transistors can be reduced.

2. Description of the Related Art

In a manufacture process of a NAND flash memory device, a SAFG (Self-Aligned Floating Gate) method is employed. This SAFG method is a technology where a tunnel oxide film and a polysilicon layer are sequentially formed on a semiconductor substrate portions of the polysilicon layer and the tunnel oxide film disposed in an element isolation region are then removed. The semiconductor substrate is then etched in a word line direction to form a trenches in the element isolation region. The trenches are then buried or filled with an insulating material to form an element isolation film while patterning the polysilicon layer.

A manufacturing method using the SAFG method can have the following problems.

First, the SAFG method is advantageous in the word line direction, but is disadvantageous in that it is difficult to shrink the device in a bit line direction because an existing RIE mode is used. That is, in the process of etching the stack structure having a high step at the same time, which consists of Poly1/ONO/Poly2/WSi/Nitride/Oxyitride, etc., there is a difficulty in etching them using the existing technology if the design rule is small.

Second, in order to form transistors in the peripheral region, after the self-aligned floating gate and the tunnel oxide film are removed, an oxidization process for forming the gate oxide film must be repeated.

Third, the process of forming a polysilicon layer for a control gate, etching the polysilicon layer for a control gate by an etch process using a hard mask and then forming an underlying polysilicon layer for a floating gate by means of a self-aligned etch mode is advantageous in that the floating gate is aligned. This process, however, is disadvantageous in that residues are generated because of by-products since several layers are etched at the same time and there is a limit to selection of chemicals for the post cleaning.

Fourth, if the polysilicon layer for the floating gate is etched by an existing reactive ion etch (RIE) method, it is difficult to set a target etch thickness or an etch end time as an etch thickness increases due to a high or large step. Therefore, etch damage can be generated in the semiconductor substrate. It is also difficult to bury or fill between-the gate lines with the insulating material since the gap between the gate lines is relatively deep.

Fifth, if the self-aligned etch process is performed in the RIE mode, etch technologies having a high selective ratio between oxide and nitride are required in order to protect the gate lines using a spacer nitride film and to form a metal contact (SAC process).

Sixth, if the SAC process is employed, there is a difficulty in lowering resistance to a target value since the area at the bottom of the metal contact reduces because of the spacer nitride film.

Seventh, a relatively thick interlayer insulating film is formed in the peripheral circuit region due to the structure of the memory cell and the transistor formed in the peripheral region and a difference in height between them. In the process of forming the contact hole, therefore, the interlayer insulating film remains in the peripheral circuit region. Accordingly, there is a problem in that the contact hole is not formed.

SUMMARY OF THE INVENTION

Accordingly, in view of the above problems, semiconductor device and method of manufacturing the same are disclosed in which a metal material of good electrical property and stress property is used as a barrier metal layer, a step between a memory cell formed in a cell region and a transistor formed in a peripheral circuit region is minimized, and the gate height in the memory cell is minimized, whereby a subsequent process is facilitated, the gate is formed high and the electrical property of the device is thus improved.

One disclosed semiconductor device comprises: an interlayer insulating film formed on the entire surface and having a damascene pattern formed in, a metal layer formed therein the damascene pattern, and a barrier metal layer formed between the metal layer and the interlayer insulating film, wherein the barrier metal layer is composed of WN or TiSiN.

In the above, the content ratio of nitrogen in TiSiN preferably ranges from 25% to 35%.

Another disclosed semiconductor device comprises: an element isolation film which is formed in an element isolation region of a semiconductor substrate, wherein a top portion of the element isolation film includes protrusions that extend above the semiconductor substrate, a gate insulating film formed on the semiconductor substrate between the protrusions of the element isolation films, a first polysilicon layer having a cylinder structure, which is formed on the gate insulating film between the protrusions of the element isolation film, a second polysilicon layer formed on an inner wall of the first polysilicon layer of the cylinder structure, wherein the second polysilicon layer is formed on a concave portion of the floating gate, a metal layer formed within the second polysilicon layer, and source/drain formed on the semiconductor substrate at the edge of the first polysilicon layers.

The semiconductor device can further comprise a dielectric film formed between the first polysilicon layer and the second polysilicon layer. In this time, the dielectric film can be formed on the entire outer wall of the second polysilicon layer.

A disclosed method of manufacturing a semiconductor device comprises: forming an element isolation film whose top is projected using an insulating material in an element isolation region of a semiconductor substrate, forming an insulating film pattern where a floating gate region is defined in an opening shape on an active region, forming a stack structure of a gate insulating film and a first polysilicon layer, which are isolated by the insulating film pattern and the protrusion of the element isolation film, on the semiconductor substrate of the floating gate region, forming a sacrificial insulating film in which a word line region is defined, on the entire surface including the first polysilicon layer, sequentially forming a dielectric film, a second polysilicon layer and a metal layer on the entire surface including the sacrificial insulating film, allowing the dielectric film, the second polysilicon layer and the metal layer to remain only in a space between the sacrificial insulating films, removing the sacrificial insulating films and the insulating film pattern, and forming source/drain on the semiconductor substrate at the edge of the first polysilicon layer.

The forming of the element isolation film and the insulating film pattern comprises: forming a pad oxide film and a pad nitride film on the semiconductor substrate, etching the pad nitride film and the pad oxide film of the element isolation region in a bit line direction, forming trenches in the semiconductor substrate of the element isolation region, etching the pad nitride film and the pad oxide film in a word line direction so that the pad nitride film remains only in a region where a floating gate will be formed, burying a space between the pad nitride films and the trenches with an insulating material, thus forming the element isolation film and the insulating film pattern, and removing the pad nitride film and the pad oxide film to expose the region where the floating gate will be formed.

In an embodiment the method can further comprise, after the trenches are formed, performing an oxidization process in order to mitigate etch damage generated on the sidewalls and at the bottom of the trenches.

In an embodiment, the method can further comprise, after the pad nitride film and the pad oxide film are removed, etching the element isolation film and the insulating film pattern at the portions, which are projected upwardly from the semiconductor substrate, in order to widen the region where the floating gate will be formed. In this time, the projected portion of the element isolation film and the insulating film pattern can be etched by a wet etch process.

In an embodiment, the method can further comprise, before the sacrificial insulating film is formed, forming an etch-stop film on the entire surface including the first polysilicon layer. In this case, the etch-stop film is etched in the same pattern as the sacrificial insulating film.

In an embodiment, the method can further comprise, before the dielectric film is formed, etching the first polysilicon layer by means of an etch process using the sacrificial insulating film as an etch mask, thus forming the first polysilicon layer in a cylinder structure.

The metal layer can be formed using tungsten. Meanwhile, the method can further comprise forming a barrier metal layer on the entire surface including the second polysilicon layer, before the metal layer is formed. The barrier metal layer can be formed using WN or TiSiN. In this time, the content of Nitrogen in the TiSiN preferably ranges from 25% to 35%. Furthermore, it is preferred that the barrier metal layer and the metal layer are consecutively formed in the same chamber.

Another disclosed method of manufacturing a semiconductor device comprises: forming an element isolation film whose top is projected using an insulating material in an element isolation region of a semiconductor substrate, and at the same time, forming an insulating film pattern where a floating gate region is defined in an opening shape in a cell region and a gate region is defined in an opening shape in a peripheral circuit region; forming a stack structure of a gate insulating film and a first polysilicon layer, which are isolated by the insulating film pattern and the protrusion of the element isolation film, on the semiconductor substrate of the floating gate region and the gate region; forming a sacrificial insulating film where a word line region and the gate region are defined, on the entire surface including the first polysilicon layer, forming a dielectric film on the cell region including the sacrificial insulating film; sequentially forming a second polysilicon layer and a metal layer on the entire surface including the sacrificial insulating film; allowing the dielectric film, the second polysilicon layer and the metal layer to remain only in a space between the sacrificial insulating films; removing the sacrificial insulating films and the insulating film pattern; and forming source/drain on the semiconductor substrate at the edge of the first polysilicon layer.

In an embodiment, the forming of the element isolation film and the insulating film pattern comprises: forming a pad oxide film and a pad nitride film on the semiconductor substrate, etching the pad nitride film and the pad oxide film of the element isolation region, forming trenches in the semiconductor substrate of the element isolation region, removing the pad nitride film in the floating gate region of the cell region and the gate region of the peripheral region, burying a space between the pad nitride films and the trenches with an insulating material, thus forming the element isolation film and the insulating film pattern, and removing the pad nitride film and the pad oxide film to expose the floating gate region and the gate region.

Meanwhile, the gate insulating film in the cell region and the peripheral circuit region have different thicknesses.

In an embodiment, the method can further comprise, after the trenches are formed, performing an oxidization process in order to mitigate etch damage generated on the sidewalls and at the bottom of the trenches.

In an embodiment, the method can further comprise, after the pad nitride film and the pad oxide film are removed, etching the projected portion of the element isolation film and the insulating film pattern in order to widen the region where the floating gate will be formed. At this time, the projected portion of the element isolation film and the insulating film pattern can be etched by a wet etch process.

In an embodiment, the method can further comprise, before the sacrificial insulating film is formed, forming an etch-stop film on the entire surface including the first polysilicon layer. In this case, the etch-stop film is etched in the same pattern as the sacrificial insulating film.

In an embodiment, the method can further comprise the step of, before the dielectric film is formed, etching the first polysilicon layer by means of an etch process using the sacrificial insulating film as an etch mask, thus forming the first polysilicon layer in a cylinder structure.

In an embodiment, the metal layer can be formed using tungsten. Meanwhile, the method can further comprise the step of forming a barrier metal layer on the entire surface including the second polysilicon layer, before the metal layer is formed. The barrier metal layer can be formed using WN or TiSiN. In this time, the content of Nitrogen in the TiSiN preferably ranges from 25% to 35%. Furthermore, it is preferred that the barrier metal layer and the metal layer be consecutively formed in the same chamber.

DETAILED DESCRIPTION OF THE PRESENTLY PREFERRED EMBODIMENTS

Figure 1:
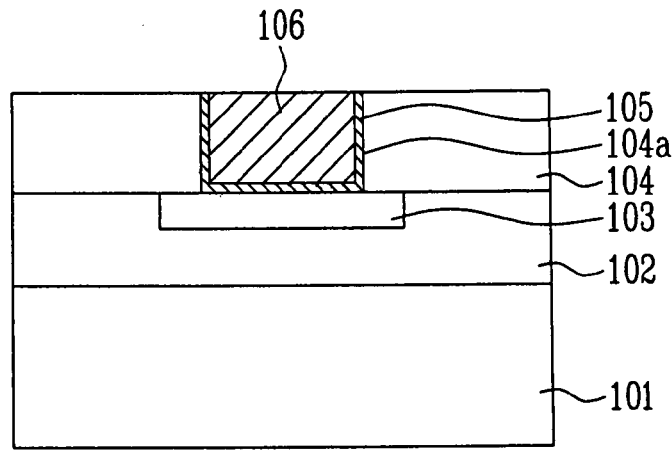
FIG. 1 is a sectional view for explaining a barrier metal layer of a disclosed semiconductor device.

Now, the preferred embodiments will be described with reference to the accompanying drawings. Since preferred embodiments are provided for the purpose of explanation to those of ordinary skill in the art, they may be modified in various manners and the scope of this disclosure is not limited by the specific preferred embodiments described herein. Further, in the drawings, the thickness and size of each layer are exaggerated for convenience and clarity. Like reference numerals are used to identify the same or similar parts. Meanwhile, in case where it is stated that one film is "on" the other film or a semiconductor substrate, the one film may directly contact the other film or the semiconductor substrate. Or, one or more additional films may be disposed between the one film and the other film or the semiconductor substrate.

FIG. 1 is a sectional view illustrating a barrier metal layer of a disclosed semiconductor device.

Referring to FIG. 1, an interlayer insulating film 104 is formed on a semiconductor substrate 101 in which a lower conductive layer 103 is formed. A damascene pattern 104a which includes a trenches or a via hole is formed in the interlayer insulating film 104. The lower conductive layer 103 can be formed using polysilicon or a common metal material. Reference numeral 102 indicates a lower interlayer insulating film.

A metal layer 106 is formed in the damascene pattern 104a in order to connect the lower conductive layer 103 to peripheral elements (not shown). In this time, the metal layer 106 is typically formed using tungsten, but can be formed using copper or aluminum.

Meanwhile, in order to prevent the electrical property from being lowered because of the metal component of the metal layer 106 being diffused into the interlayer insulating film 104, a barrier metal layer 105 is formed between the metal layer 106 and the interlayer insulating film 104.

Generally, the barrier metal layer 105 has a stack structure of Ti/TiN. In the present invention, the barrier metal layer 105 is formed using WN or TiSiN. Of them, TiSiN is a material having a better electrical property and stress property than the stack structure of Ti/TiN. It is possible to control specific resistance and stress property of the TiSiN film by controlling the Nitrogen content.

Figure 2A:
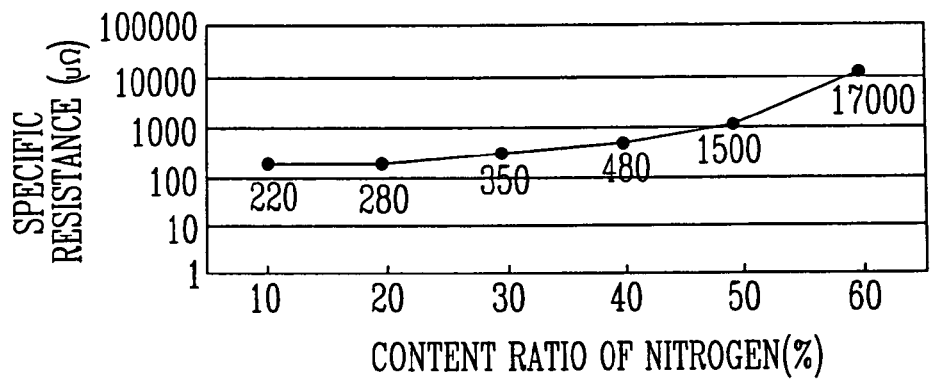
FIGS. 2A and 2B are characteristic graphs showing electrical properties of TiSiN.
Figure 2B:
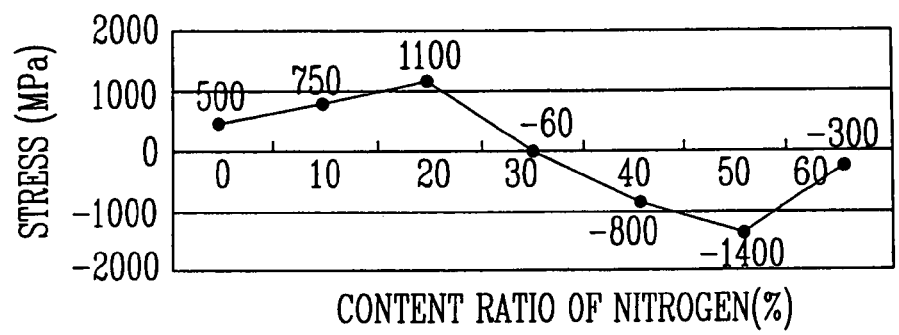

FIGS. 2A and 2B are characteristic graphs showing electrical properties of TiSiN.

From FIG. 2A, it can be seen the lower the content ratio of nitrogen in the TiSiN film, the lower the specific resistance.

Meanwhile, from FIG. 2B, it can be seen that stress is the lowest when the content ratio of nitrogen in the TiSiN film is about 30% and the stress property is abruptly degraded around 30%.

It is preferred that if a specific resistance characteristic is preferentially considered depending on the property, the content ratio of nitrogen is minimized, and if the stress property is preferentially considered, the content ratio of nitrogen is set to about 30%. If the specific resistance characteristic and the stress property are considered at the same time, the nitrogen content preferably ranges from 25% to 35%.

Even when the barrier metal layer 105 is formed using WN, it is preferred that the content ratio of nitrogen is set in consideration of the electrical characteristic and stress property.

As such, according to the present invention, by forming the barrier metal layer 105 using WN or TiSiN, a better electrical characteristic can be obtained than the conventional barrier metal layer composed of the stack structure of Ti/TiN.

A method of manufacturing the flash memory device employing the aforementioned barrier metal layer will now be described.

Figure 3:
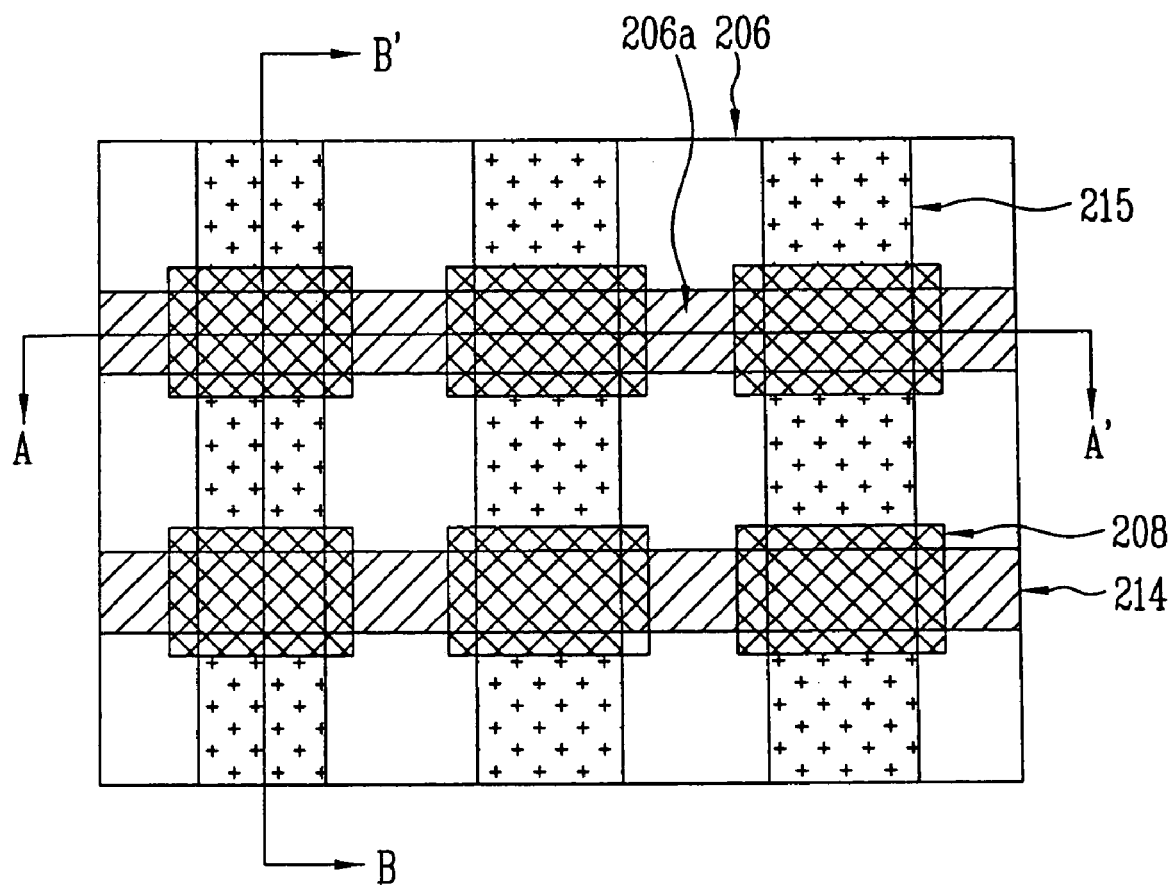
FIG. 3 is a layout diagram showing a flash memory cell region a disclosed semiconductor device.

FIG. 3 is a layout diagram showing the flash memory cell region in the semiconductor device according to the present invention. FIGS. 4 to 21 are sectional views for explaining a method of manufacturing a flash memory device according to an embodiment of the present invention.

Figure 4:
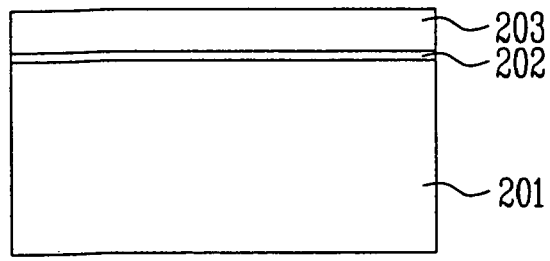
FIGS. 4 to 21 are sectional views explaining a disclosed method of manufacturing a flash memory device.
Figure 4:
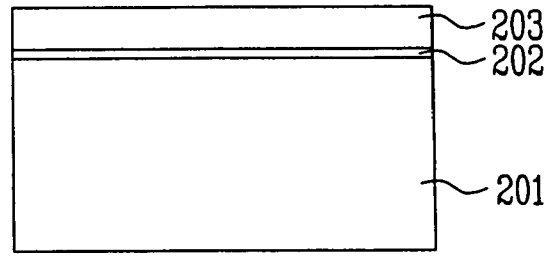

Referring to FIG. 4, a pad oxide film 202 and a pad nitride film 203 are sequentially formed on a semiconductor substrate 201. At this time, a thickness of the pad nitride film 203 can be decided in such a manner that an element isolation film to be formed in a subsequent process is projected higher than the semiconductor substrate 201. Therefore, the thickness of the pad nitride film 203 is preferably decided considering the above fact. For example, the pad nitride film 203 can be formed with a thickness ranging from 500 Å to 1500 Å.

Figure 5:
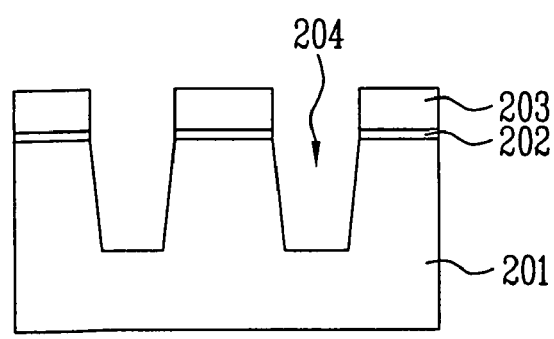
Figure 5:
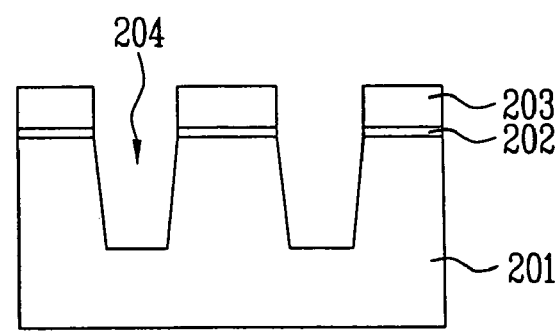

Referring to FIG. 5, the pad nitride film 203 and the pad oxide film 202 are patterned to expose the semiconductor substrate 201 in the element isolation region where the element isolation film will be formed. At this time, in the cell region, the pad nitride film 203 is patterned in a bit line direction. After the pad nitride film 203 is patterned, the exposed semiconductor substrate 201 is etched to form trenches 204. Thereby, the trenches 204 are formed in the cell region and the element isolation region of the peripheral region.

Figure 6:
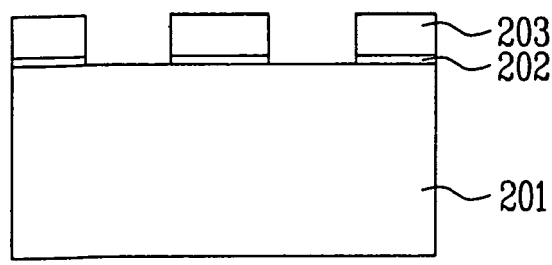

Next, the pad nitride film 203 is patterned again. That is, as shown in FIG. 6, in the cell region, the pad nitride film 203 is secondarily etched so that the pad nitride film 203 is patterned in a word line direction. In this time, in the peripheral circuit region, the pad nitride film 203 is etched so that the gate region of the transistor has an opening shape. In this time, the pad oxide film 202 can be also etched. Thereby, the pad nitride film 203 of the cell region is patterned both in the word line direction A-A' and the bit line direction B-B'. In the cell region, as the pad nitride film 203 is etched in the word line direction once, the semiconductor substrate 201 is partially exposed.

In the above, what the pad nitride film 203 of the cell region is patterned in the word line direction A-A' once again is for defining a region where a polysilicon layer for a floating gate will be formed in the cell region. That is, in the cell region, a region where the pad nitride film 203 remains becomes a region where the floating gate of the flash memory will be formed. Meanwhile, in the peripheral region, a region where the pad nitride film 203 remains become a region where the polysilicon layer for the gate electrode of the transistor will be formed.

Figure 7:
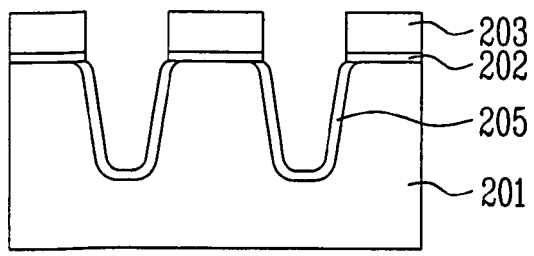
Figure 7:
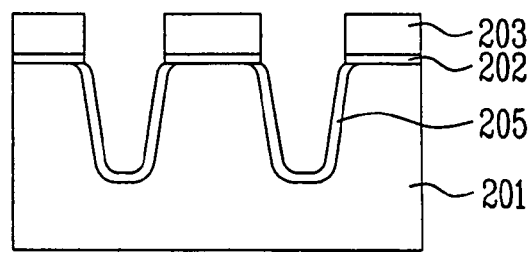

Referring to FIG. 7, in order to compensate for etch damage generated in the etch process for forming the trenches 204, the sidewalls of the trenches 204 are oxidized to form a liner oxide film 205. As a damaged layer generated on the sidewalls and at the bottom of the trenches 204 is formed by the liner oxide film 205, the damaged layer is removed and the liner oxide film 205 becomes some of the element isolation film.

Figure 8:
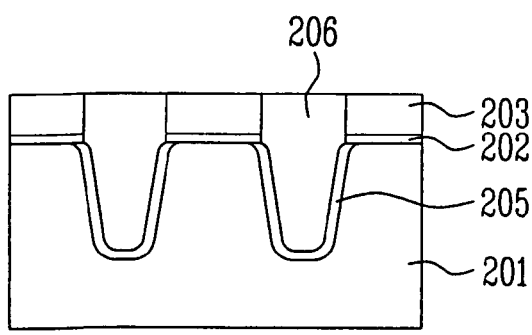
Figure 8:
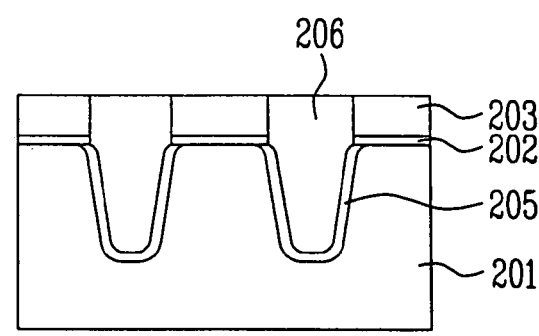

Referring to FIG. 8, the trenches 204 are buried with an insulating material to form an element isolation film 206. The element isolation film 206 can be formed by burying the trenches 204 using high-density plasma (HDP) oxide. In this time, the insulating material deposited on the pad nitride film 203 can be removed by chemical mechanical polishing (CMP), wherein HSS (High Selective Slurry) can be used as a polisher.

Figure 9:
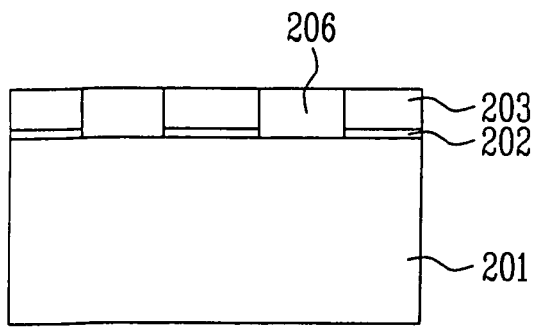

Meanwhile, in the cell region, the trenches 204 are filled with the insulating material 206 with the pad nitride film 203 being patterned in the bit line direction B-B', as shown in FIG. 9. Thus, even spaces between the pad nitride films 203 are filled with the insulating material 206 for the element isolation film in the bit line direction B-B'. As such, the insulating material 206 for the element isolation film, which is buried into the spaces between the pad nitride films 203, becomes an insulating film pattern for defining the region where the floating gate will be formed in a subsequent process.

Figure 10:
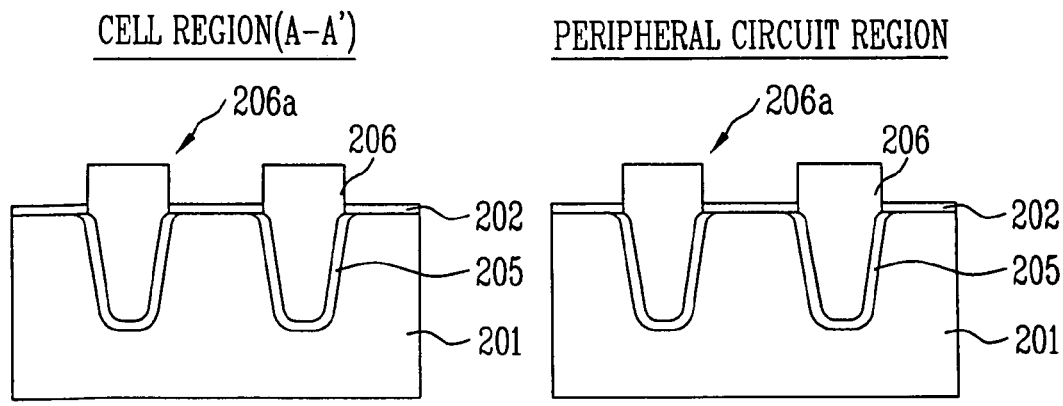

Referring to FIG. 10, the pad nitride film (203 in FIGS. 8 and 9) is removed. As the pad nitride film (203 in FIGS. 8 and 9) is removed, the element isolation film 206 remains so that protrusions 206a of the insulation layer 206 project above the semiconductor substrate 201. Furthermore, in the cell region, the insulating material layer (206 in FIG. 9) remains on the semiconductor substrate 201 in the bit line direction. The insulation material 206 in the cell region is in the form of an open shape pattern in which the floating gate region is disposed.

The same is true of even in the peripheral circuit region. That is, although not shown in the drawings, the insulating material layer remains even on the active region of the peripheral region, and remains in the form of an open shape pattern in which the gate region of the transistor is disposed.

Figure 11:
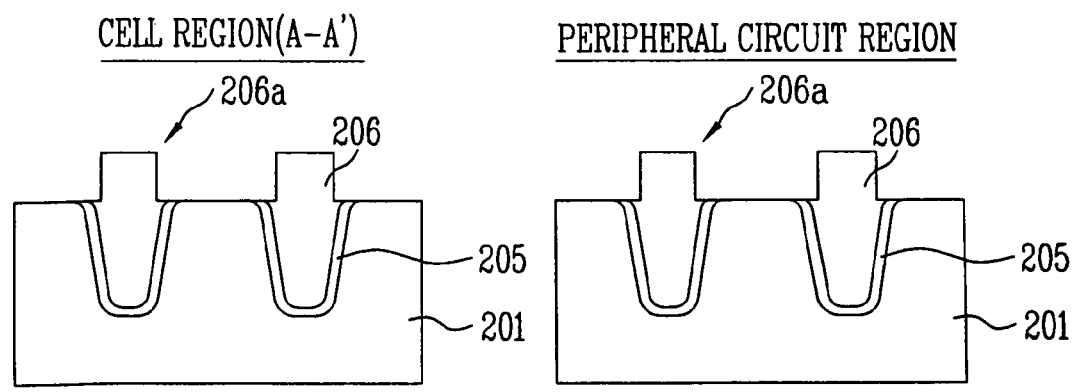

Referring to FIG. 11, the protrusions 206a of the element isolation film 206, which are projected higher than the semiconductor substrate 201, are etched to a given thickness or width. The protrusions 206a of the element isolation film 206 can be etched by a wet etch process. In the wet etch process, a fluorine-based solution can be used as an etchant.

Figure 12:
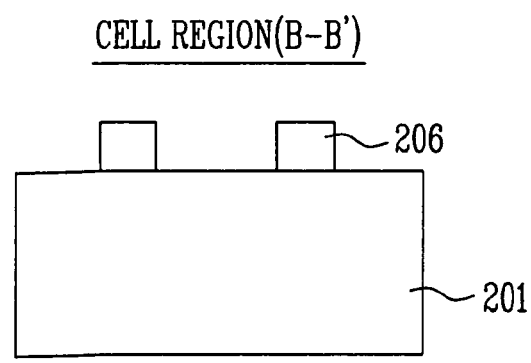

Thereby, the width of the protrusions 206a of the element isolation film 206 is narrowed and the height is reduced. At this time, as shown in FIG. 12, the width of the insulating material 206, which remains in the bit line direction B-B' in the cell region, is narrowed and the height thereof is reduced. If the width of the protrusions 206a of the element isolation film 206 is narrowed and the distance between neighboring protrusions 206a is increased, the area in which the polysilicon layer for the floating gate will be formed also increases.

Meanwhile, in the procedure of etching the protrusions 206a of the element isolation film 206, the pad oxide film (202 in FIG. 11) remaining on the semiconductor substrate 201 is also removed.

Figure 13:
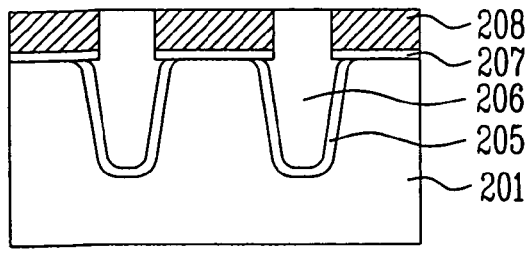
Figure 13:
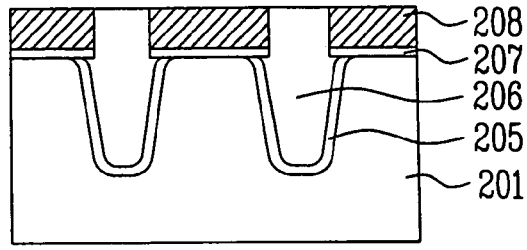

Referring to FIG. 13, gate insulating films 207 and first polysilicon layers 208 are sequentially formed on the semiconductor substrate 201 between the protrusions 206a. This will be described in more detail. The gate insulating films 207 are formed on the semiconductor substrate 201 between the protrusions 206a. After a polysilicon layer is formed on the entire surface to bury the spaces between the protrusions 206a, the polysilicon layer on the pad nitride film 203 is stripped by CMP, so that the first polysilicon layer 208 remain only in the spaces between the protrusions 206a.

At this time, the gate insulating film 207 formed in the cell region becomes a tunnel oxide film of the flash memory cell, and the gate insulating film 207 formed in the peripheral regions become a gate oxide film of the transistor. As the tunnel oxide film and the gate oxide film are quite different in thickness, there are preferably formed by a different process. As such, the method of forming the tunnel oxide film and the gate oxide film by a different process is well known in the art.

Figure 14:
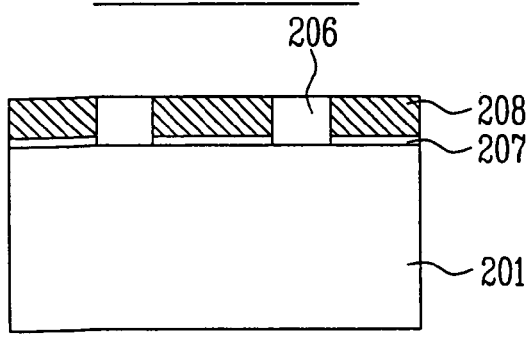

Meanwhile, as shown in FIG. 14, the first polysilicon layers 208 of the cell region are isolated both in the bit line direction B-B' and the word line direction by means of the protrusions 206a of the element isolation film 206 and the insulating material 206 remaining on the semiconductor substrate 201. Accordingly, the first polysilicon layers 208 can be used as the floating gate even without further patterning process.

Furthermore, the edges of the first polysilicon layers 208 are formed in superposition on the element isolation film 206, and are formed in a narrow space even in the bit line direction B-B'. It is thus possible to maximize the area of the first polysilicon layer 208.

Through the above method, while the element isolation film 206 is formed in the element isolation region, the first polysilicon layer 208, which is isolated both in the word line direction A-A' and the bit line direction B-B', can be formed on the semiconductor substrate 201. This method is called a self-aligned floating gate (SAFG) process.

At this time, the first polysilicon layer 208 formed in the cell region is for forming the floating gate of the flash memory cell, and the first polysilicon layers 208 formed in the peripheral region is for forming the gate of the transistor.

Figure 15:
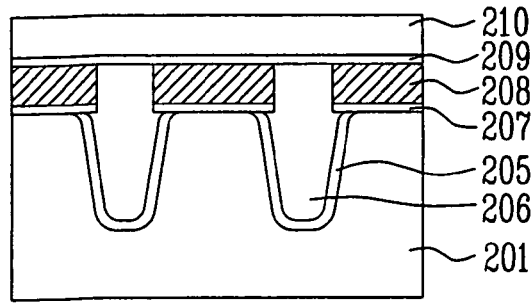
Figure 15:
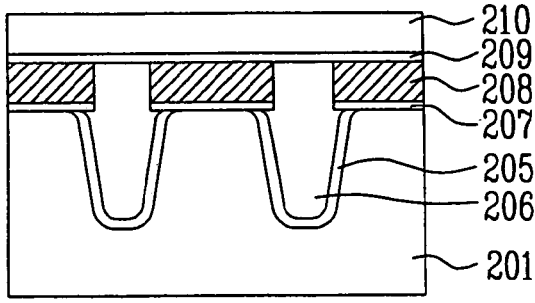

Referring to FIG. 15, an etch-stop film 209 and a sacrificial insulating films 210 are sequentially formed on the entire surface including the first polysilicon layer 208. At this time, the sacrificial insulating film 210, for defining a region where a second polysilicon layer to be formed in a subsequent process, will be formed. Furthermore, a thickness of the second polysilicon layer to be formed in a subsequent process is decided according to a thickness of the sacrificial insulating film 210. It is thus preferred that the thickness of the sacrificial insulating film 210 be set considering the above fact.

Meanwhile, the etch-stop film 209 serves to prevent underlying elements (for example, polysilicon layer) from being etched in a subsequent etch process. However, if the etch selective ratio against the underlying elements when the sacrificial insulating film 210 is etched is controlled, the etch-stop film 209 can be omitted.

Hereinafter, in order to facilitate understating, description will be made with reference to the sectional view taken along line B-B' in the bit line direction in the layout diagram of FIG. 3 will be described. Therefore, the element isolation film is not shown in the subsequent drawings.

Figure 16:
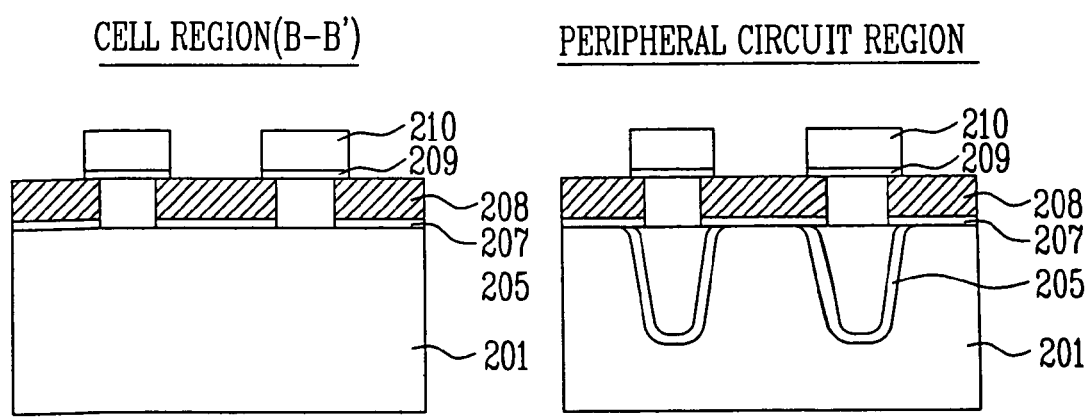

Referring to FIG. 16, the sacrificial insulating film 210 is patterned by an etch process using the gate mask. In this time, if the etch-stop film 209 is formed, the etch-stop film 209 is used as the etch-stop layer. After the sacrificial insulating film 210 is etched, the etch-stop film 209 is additionally etched. Thereby, in the cell region, the region from which the sacrificial insulating films 210 is etched becomes a region where the control gate will be formed.

Figure 17:
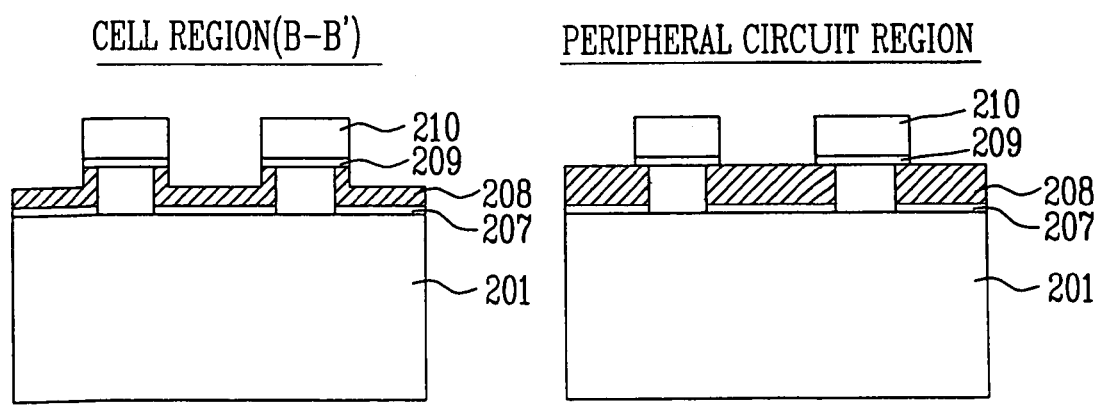

Referring to FIG. 17, the exposed portions of the first polysilicon layer 208 in the cell region are etched by a given thickness by means of an etch process using the sacrificial insulating films 210 as an etch mask. Thus, the first polysilicon layer 208 of the cell region is formed to have a μ shape as shown in the left of FIG. 17. As the surface area increases, the coupling ratio of the flash memory cell can be increased.

This process can be performed only in the cell region and can be performed even in the peripheral circuit region at the same time.

Figure 18:
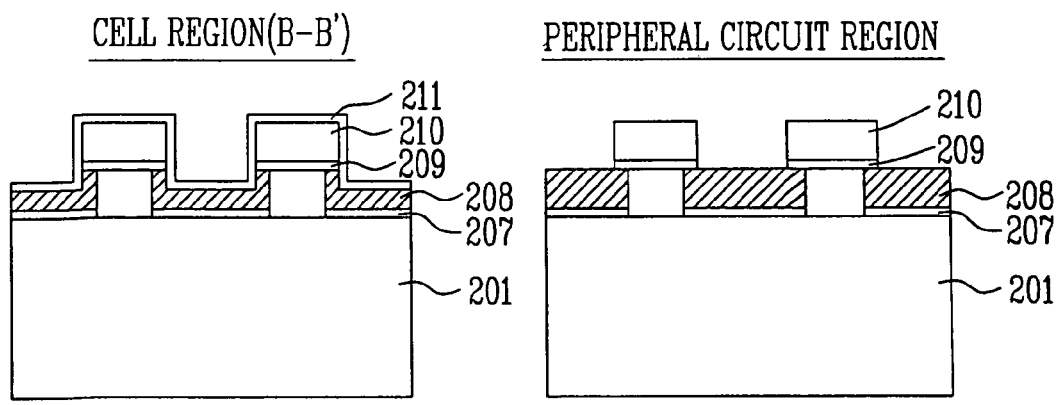

Referring to FIG. 18, a dielectric film 211 is formed in the cell region. In this time, if the dielectric film 211 is formed even in the peripheral region, a polysilicon layer to be formed in a subsequent process and the first polysilicon layers 208 are electrically isolated. The same structure as the flash memory cell is formed. Accordingly, the dielectric film 211 is formed only in the cell region so that the polysilicon layer to be formed in the subsequent process and the first polysilicon layers 208 are electrically connected in the peripheral region.

This dielectric film 211 is then formed to have an ONO (Oxide-Nitride-Oxide) structure.

Figure 19:
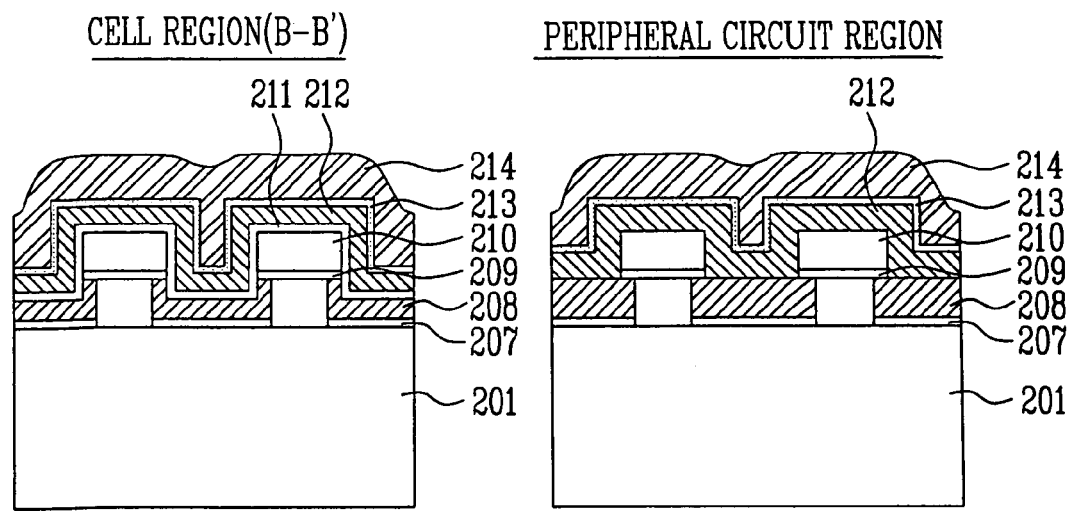

Referring to FIG. 19, a second polysilicon layer 212 for a control gate is formed on the entire surface of the cell region and the peripheral region. A metal layer 214 is formed on the second polysilicon layer 212.

The second polysilicon layer 212 is preferably formed with a thickness of the degree that it can be formed with a concave cross-section, while maintaining the step by the sacrificial insulating films 210 without completely burying the space between the sacrificial insulating films 210. For example, the second polysilicon layer 212 can be formed with a thickness ranging from 300 to 1000 Å.

Meanwhile, since the second polysilicon layer 212 is formed on the first polysilicon layer 208 with a concave shape in the cell region, the first polysilicon layers 208 and the second polysilicon layer 212 overlap even in the sidewall of the first polysilicon layers 208. Thus, the entire coupling ratio of the flash memory cell can be increased. Furthermore, in the peripheral circuit region, since the second polysilicon layer 212 is formed with the dielectric film 211 not being formed, the second polysilicon layer 212 and the first polysilicon layers 208 are directly brought into contact. Accordingly, the first polysilicon layers 208 and the second polysilicon layer 212 become the gates of the transistors.

Meanwhile, the metal layer 214 is preferably formed using tungsten. In this case, a barrier layer 213 is preferably formed between the metal layer 214 and the second polysilicon layer 212. The barrier layer 213 is preferably formed using WN or TiSiN.

If the barrier layer 213 is formed using WN, it can be formed in such a manner that while WN is deposited by supplying a nitrogen-containing gas (for example, $NH_3$ or $N_2$) upon deposition of tungsten, the supply of the nitrogen-containing gas is stopped and a tungsten layer is formed. At this time, the supply time of the nitrogen-containing gas is controlled so that WN is deposited to a thickness ranging from about 10 to about 50 Å. Furthermore, tungsten is preferably formed to a thickness by which the spaces between the sacrificial insulating films 210 are completely buried, preferably to a thickness ranging from 500 to 2000 Å.

If the barrier layer 213 is formed using TiSiN, after TiSiN is first deposited while replacing only a supply gas in the deposition apparatus, the metal layer 214 can be directly formed in-situ without vacuum breakage or time delay. If the barrier layer 213 is formed using TiSiN, it can be formed to a thickness ranging from 20 to 200 Å. As described with reference to FIGS. 2A and 2B, specific resistance or the stress property is controlled by controlling the content ratio of N2.

Figure 20:
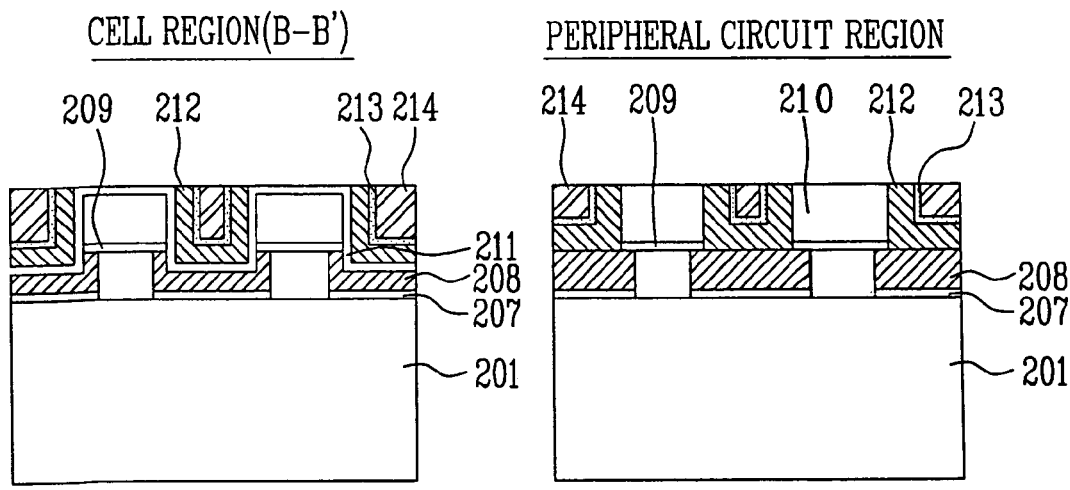

Referring to FIG. 20, the metal layer 214, the barrier layer 213 and the second polysilicon layer 212 on the sacrificial insulating films 210 are removed so that the second polysilicon layer 212, the barrier layer 213 and the metal layer 214 remain only in the spaces between the sacrificial insulating films 210. This process can be performed in such a manner the metal layer 214, the barrier layer 213 and the second polysilicon layer 212 are polished by CMP until the surface of the insulating film contained in the dielectric film 211 of the cell region or the sacrificial insulating films 210 of the peripheral region is exposed.

At this time, the polishing process can be performed in such a way that the second polysilicon layer 212 is used as a first etch-stop film when the metal layer 214 and the barrier layer 213 are polished, the metal layer 214 and the barrier layer 213 are polished and excessive polishing is then performed to polish up to the second polysilicon layer 212. Meanwhile, when the second polysilicon layer 212 is polished, it is preferred that the polishing selective ratio is secure by maximum so that polishing loss (dishing or erosion) is prevented from occurring in the metal layer 214.

Thereby, in the cell region, the metal layer 214, the barrier layer 213 and the second polysilicon layer 212 are isolated in a predetermined pattern by the sacrificial insulating films 210. They become the control gates of the flash memory cells. Also, in the peripheral region, the metal layer 214, the barrier layer 213, the second polysilicon layer 212 and the first polysilicon layers 208 become the gate electrodes of the transistors.

Figure 21:
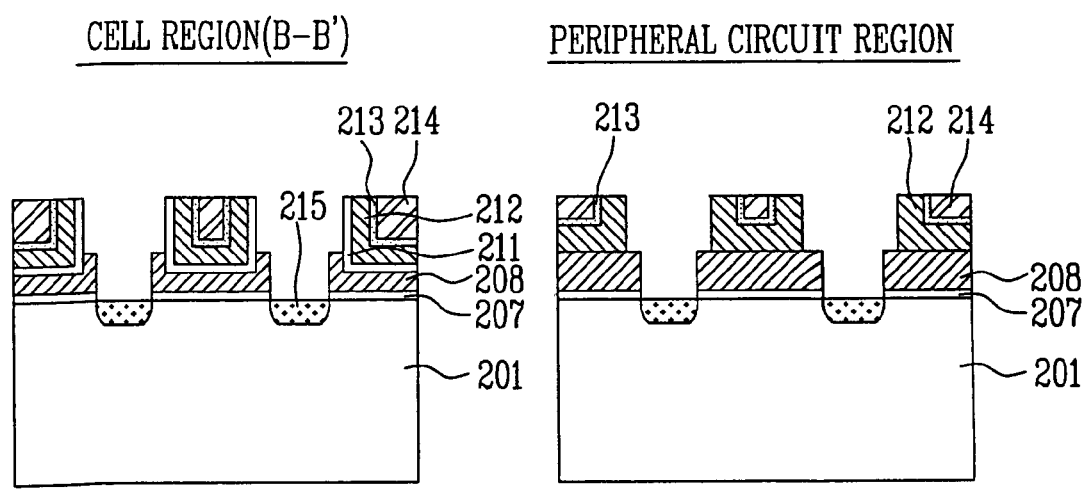

Referring to FIG. 21, materials remaining on the semiconductor substrate 201 between the first polysilicon layers 208 are all removed. An impurity is then injected into the active region of the exposed semiconductor substrate 201, thus forming source/drain 215. At this time, even in the peripheral region, an impurity is injected into the semiconductor substrate 201, which is exposed as the insulating material is removed, thus forming source/drain of the transistor. Thereby, the flash memory cells are formed in the cell region and the transistors are formed in the peripheral circuit region.

It was found that a step is rarely generated in the flash memory cell and the transistor, which are completed, except that the step is generated about in a thickness of the dielectric film 211. If up to the dielectric film 211 on the sacrificial insulating films 210 is removed, the steps of the flash memory cell and the transistor can be made same.

Furthermore, since the control gate is formed in the concave portion of the first polysilicon layers 208, the entire height of the flash memory cell can be reduced. As the metal layer 214 is also formed in the concave portion of the second polysilicon layer 212, the entire height can be further reduced. This allows a subsequent process to be performed more easily.

Also, not only the patterning process for forming the control gate is performed in the polishing process not the etch process, but also the first polysilicon layers 208 is previously patterned. Thus, the metal layer 214 and the second polysilicon layer 212 only can be polished. Accordingly, etch load of the patterning process can be reduced and generation of residues by etch by-products can be prohibited.

Meanwhile, after an interlayer insulating film is formed on the entire surface by a subsequent process, a contact hole is formed, and the contact hole is buried with a conductive material to form a contact plug. This process is carried out with the sidewall of the second polysilicon layer 212 being surrounded by the dielectric film 211. Therefore, it can prevent etch damage from being generated on the sidewall of the second polysilicon layer 212 or the second polysilicon layer 212 and the contact plug from being brought into contact. That is, the dielectric film 211 serves as even an insulating film spacer of the second polysilicon layer 212.

As described above, a metal material having good electrical and stress properties is used as a barrier metal layer, a step between a memory cell formed in a cell region and a transistor formed in a peripheral circuit region is minimized, and the height of the memory cell is minimized. Therefore, when a subsequent process is facilitated, problems caused by that a gate is formed high are solved, and the electrical property of the device can be improved.

Although the foregoing description has been made with reference to the preferred embodiments, it is to be understood that changes and modifications may be made by the ordinary skilled in the art without departing from the spirit and scope of this disclosure and the appended claims.

What is claimed is:

1. A method of manufacturing a semiconductor device comprising:
   (a) forming an element isolation film with an insulating material in an element isolation region of a semiconductor substrate, the element isolation film comprising protrusions that project above the substrate, and forming an open insulating film pattern for accommodating a floating gate on an active region;
   (b) forming a stack structure of a gate insulating film and a first polysilicon layer, on the semiconductor substrate in the floating gate region, which are isolated by the insulating film pattern and the protrusions of the element isolation film;
   (c) forming a sacrificial insulating film on the entire surface including the first polysilicon layer in which a word line region is defined;
   (d) sequentially forming a dielectric film, a second polysilicon layer and a metal layer on the resulting structure including the sacrificial insulating film;
   (e) allowing the dielectric film, the second polysilicon layer and the metal layer to remain only in a space between the sacrificial insulating films;
   (f) removing the sacrificial insulating film and the insulating film pattern; and
   (g) forming a source/drain on the semiconductor substrate at the edge of the first polysilicon layer.

2. The method as claimed in claim 1, wherein part (a) of the forming of the element isolation film and the insulating film pattern comprises:
   (a-1) forming a pad oxide film and a pad nitride film on the semiconductor substrate;
   (a-2) etching the pad nitride film and the pad oxide film of the element isolation region in a bit line direction;
   (a-3) forming trenches in the semiconductor substrate of the element isolation region;
   (a-4) etching the pad nitride film and the pad oxide film in a word line direction so that the pad nitride film remains only in a region where a floating gate will be formed;
   (a-5) filling a space between the pad nitride films and the trenches with an insulating material, thus forming the element isolation film and the insulating film pattern; and
   (a-6) removing the pad nitride film and the pad oxide film to expose the region where the floating gate will be formed.

3. The method as claimed in claim 2, further comprising, after the trenches are formed, performing an oxidization process in order to mitigate etch damage generated on the sidewalls and at the bottom of the trenches.

4. The method as claimed in claim 2, further comprising, after the pad nitride film and the pad oxide film are removed, etching the protrusions of the element isolation film and the insulating film pattern in order to widen a the region where the floating gate will be formed.

5. The method as claimed in claim 4, wherein the protrusions of the element isolation film and the insulating film pattern are etched by a wet etch process.

6. The method as claimed in claim 1, further comprising, before the sacrificial insulating film is formed, forming an etch-stop film on the entire surface including the first polysilicon layer, wherein the etch-stop film is etched in the same pattern as the sacrificial insulating film.

7. The method as claimed in claim 1, further comprising, before the dielectric film is formed, etching the first polysilicon layer by means of an etch process using the sacrificial insulating film as an etch mask, thus forming the first polysilicon layer in a cylinder structure.

8. The method as claimed in claim 1, wherein the metal layer comprises tungsten.

9. The method as claimed in claim 1, further comprising, forming a barrier metal layer on the entire surface including the second polysilicon layer, before the metal layer is formed.

10. The method as claimed in claim 9, wherein the barrier metal layer comprises WN or TiSiN.

11. The method as claimed in claim 10, wherein the barrier metal layer comprises TiSiN and the content of nitrogen in the TiSiN ranges from 25% to 35%.

12. The method as claimed in claim 9, wherein the barrier metal layer and the metal layer are consecutively formed in the same chamber.

13. A method of manufacturing a semiconductor device comprising:
   (a) forming an element isolation film with a top surface having upwardly directed protrusions using an insulating material in an element isolation region of a semiconductor substrate, and at the same time, forming an insulating film pattern from said protrusions where a floating gate region is defined by said pattern in a cell region and a gate region is defined by said pattern in a peripheral circuit region;
   (b) forming a stack structure of a gate insulating film and a first polysilicon layer, which are isolated by the insulating film pattern and the protrusions of the element isolation film, on the semiconductor substrate of the floating gate region and the gate region;
   (c) forming a sacrificial insulating film where a word line region and the gate region are defined, on the entire surface including the first polysilicon layer;
   (d) forming a dielectric film on the cell region including the sacrificial insulating film;
   (e) sequentially forming a second polysilicon layer and a metal layer on the entire surface including the sacrificial insulating film;
   (f) allowing the dielectric film, the second polysilicon layer and the metal layer to remain only in a space between the sacrificial insulating film;
   (g) removing the sacrificial insulating film and the insulating film pattern; and
   (h) forming a source/drain on the semiconductor substrate at the edge of the first polysilicon layer.

14. The method as claimed in claim 13, wherein part (a) of forming the element isolation film and the insulating film pattern comprises:
   (a-1) forming a pad oxide film and a pad nitride film on the semiconductor substrate;
   (a-2) etching the pad nitride film and the pad oxide film of the element isolation region;

(a-3) forming trenches in the semiconductor substrate of the element isolation region;

(a-4) removing the pad nitride film in the floating gate region of the cell region and the gate region of the peripheral circuit region;

(a-5) burying a space between the pad nitride films and the trenches with an insulating material, thus forming the element isolation film and the insulating film pattern; and (a-6) removing the pad nitride film and the pad oxide film to expose the floating gate region and the gate region.

15. The method as claimed in claim 13, wherein the gate insulating film has a different thickness in the cell region and the peripheral circuit region.

16. The method as claimed in claim 14, further comprising, after the trenches are formed, performing an oxidization process in order to mitigate etch damage generated on the sidewalls and at the bottom of the trenches.

17. The method as claimed in claim 14, further comprising, after the pad nitride film and the pad oxide film are removed, etching the projected portion of the element isolation film and the insulating film pattern in order to widen the region where the floating gate will be formed.

18. The method as claimed in claim 17, wherein the projected portion of the element isolation film and the insulating film pattern are etched by a wet etch process.

19. The method as claimed in claim 13, further comprising, before the sacrificial insulating film is formed, forming an etch-stop film on the entire surface including the first polysilicon layer, wherein the etch-stop film is etched in the same pattern as the sacrificial insulating film.

20. The method as claimed in claim 13, further comprising, before the dielectric film is formed, etching the first polysilicon layer of the cell region by an etch process using the sacrificial insulating film as an etch mask, thus forming the first polysilicon layer of the cell region in a cylindrical structure.

21. The method as claimed in claim 13, wherein the metal layer is formed using tungsten.

22. The method as claimed in claim 13, further comprising, forming a barrier metal layer on the entire surface including the second polysilicon layer, before the metal layer is formed.

23. The method as claimed in claim 22, wherein the barrier metal layer comprises WN or TiSiN.

24. The method as claimed in claim 23, wherein the barrier metal layer comprises TiSiN and a the content of nitrogen in the TiSiN ranges from 25% to 35%.

25. The method as claimed in claim 23, wherein the barrier metal layer and the metal layer are consecutively formed in the same chamber.

* * * * *